United States Patent [19]

Kato

[11] Patent Number: 5,808,356

[45] Date of Patent: Sep. 15, 1998

[54] LEAD-FRAME HAVING UNUSED INPUT/OUTPUT TERMINALS SEPARATED FROM INPUT/OUTPUT TERMINALS CONNECTED TO INPUT/OUTPUT STRIP LINES

[75] Inventor: Hiroshi Kato, Tokyo, Japan

[73] Assignee: NEC Corporation, Tokyo, Japan

[21] Appl. No.: 831,699

[22] Filed: Apr. 10, 1997

[30] Foreign Application Priority Data

Apr. 16, 1996 [JP] Japan ................................. 8-093734

[51] Int. Cl.[6] .................................................. H01L 23/52
[52] U.S. Cl. ............................................. 257/691; 257/666
[58] Field of Search ................................. 257/666, 690, 257/691, 692, 693

[56] References Cited

U.S. PATENT DOCUMENTS 5,327,009   7/1994   Igeta ........................................ 257/666
5,592,020   1/1997   Nakao et al. ........................... 257/666

FOREIGN PATENT DOCUMENTS 1-284006   11/1989   Japan .

Primary Examiner—Jerome Jackson
Assistant Examiner—Nathan K. Kelley
Attorney, Agent, or Firm—Foley & Lardner

[57] ABSTRACT

A lead-frame for a semiconductor device has an input lead partially projecting from both sides of the semiconductor device and an output lead projecting from both sides of the semiconductor device and connected through bonding wires to bonding pads on a semiconductor chip, and one end portion of the input lead and one end portion of the output lead both unused for an electrical connection to a circuit board are separated from the remaining portions so as to decrease a parasitic capacitance.

8 Claims, 4 Drawing Sheets

LEAD-FRAME HAVING UNUSED INPUT/OUTPUT TERMINALS SEPARATED FROM INPUT/OUTPUT TERMINALS CONNECTED TO INPUT/OUTPUT STRIP LINES

FIELD OF THE INVENTION

This invention relates to a semiconductor device and, more particularly, to a lead-frame incorporated in the semiconductor device.

DESCRIPTION OF THE RELATED ART

A typical example of an 8-pin SOP lead-frame 1 for an 8-pin SOP package is illustrated in FIG. 1 together with a semiconductor chip 2. A field effect transistor (not shown) is fabricated on the semiconductor chip 1. The field effect transistor has a source electrode exposed to the back surface of the semiconductor chip 1.

The prior art lead-frame 1 is broken down into a die pad 1a and leads 1b/1c. The semiconductor chip 2 is bonded to the die pad 1a, and a plurality of conductive source terminals 1d project from both sides of the die pad 1a. The source terminals 1d are electrically connected through the die pad 1a to the source electrode of the field effect transistor. The leads 1b/1c are arranged on both sides of the die pad 1a in parallel thereto, and are spaced from the die pad 1a. The leads 1b/1c have a strip configuration, and serve as a signal input port and a signal output port, respectively. For this reason, the leads 1b/1c are referred to as "input lead" and "output lead", respectively.

The input lead 1b has a first input terminal 1ba at one end of the prior art lead-frame 1 and a second input terminal 1bb at the other end of the prior art lead-frame 1. The output lead 1c has a first output terminal 1ca on the same side as the second input terminal 1bb and a second output terminal 1cb on the same side as the first input terminal 1ba. When the prior art lead-frame 1 and the semiconductor chip 2 are sealed in a package 3, the first input terminal 1ba and the second output terminal 1cb project from the package 3 on one side, and the second input terminal 1bb and the first output terminal 1ca project from the package 3 on the other side as shown in FIGS. 2 and 3. Thus, the first input terminal 1ba and the first output terminal 1ca are integral with the second input terminal 1bb and the second output terminal 1cb, respectively.

A plurality of bonding pads 2a/2b are formed on the upper surface of the semiconductor chip 2, and are arranged in two rows. The row of bonding pads 2a and the row of bonding pads 2b are electrically connected to the input lead 1b and the output lead 1c, respectively, by means of conductive bonding wires 4a and 4b.

The prior art semiconductor device is mounted on a circuit board 5 as shown in FIGS. 2 and 3. The circuit board 5 has an input strip line 5a, an output strip line 5b and a ground strip line 5c on an insulating substrate 5d. The second input terminal 1bb is held in contact with the input strip line 5a, and the first input terminal 1ba is electrically isolated from the input strip line 5a. Similarly, the second output terminal 1cb is held in contact with the output strip line 5b, and the first output terminal 1ca is electrically isolated from the output strip line 5b. The source terminals 1d are held in contact with the ground strip line 5c.

The prior art semiconductor device encounters a problem in a large parasitic inductor 6. This is because of the fact that the input strip line 5a is electrically connected to the second input terminal 1bb only. The parasitic inductance of the prior art lead-frame 1 for the 8-pin SOP package is 0.99 nH, and increases the impedance by about 15 ohms at 2 GHz.

When a manufacturer tries to achieve the impedance matching for the prior art semiconductor device, the large parasitic inductance between the input/output strip lines 5a/5b and the field effect transistor is causative of a loss due to the impedance matching, and the prior art lead-frame 1 can not effectively transfer the gain of the field effect transistor to the output strip line 5b. Thus, the first problem inherent in the prior art lead-frame 1 is the large parasitic inductance.

The second problem inherent in the prior art lead-frame relates to the large parasitic inductance. In order to achieve the impedance matching, a capacitive stub is usually required on the circuit board 5. The parasitic inductance takes place in not only the first and second input/output terminals 1ba/1bb and 1ca/1cb but also the bonding wires 4a/4b and the semiconductor chip 2, and the total parasitic inductance is very large. For this reason, it is recommendable to place the capacitive stub as close to the input/output terminals 1ba/1bb and 1ca/1cb as possible. However, such a close position is not always available for the large capacitive stub. Thus, the positional limitation makes the impedance matching difficult.

Japanese Patent Publication of Unexamined Application No. 1-284006 proposes to divide a large input terminal or a large output terminal into a plurality of small input terminals or a plurality of small output terminals. The prior art lead-frame disclosed in the Japanese Patent Publication of Unexamined Application insists on reduction of inductance coupled to the input terminal, the output terminal and the bonding wires.

SUMMARY OF THE INVENTION

It is therefore an important object of the present invention to provide a lead-frame which decreases a parasitic inductance.

To accomplish the object, the present invention proposes to separate unused input/output terminals from input/output terminals electrically connected to input/output strip lines.

In accordance with the present invention, there is provided a lead-frame used in a semiconductor device, comprising: a pad portion for mounting a semiconductor chip thereon; at least one source terminal connected to the pad portion, and having a leading end portion projecting from a package of the semiconductor device; at least one input lead provided on a first side of the pad portion, and having a first terminal portion electrically connected to at least one first bonding pad on the semiconductor chip and partially projecting from a first side of the package and a second terminal portion electrically isolated from the first terminal portion and partially projected from a second side of the package; and at least one output lead provided on a second side of the pad portion, and having a third terminal portion electrically connected to at least one second bonding pad on the semiconductor chip and partially projecting from one of the first and second sides of the package and a fourth terminal portion electrically isolated from the third terminal portion and partially projected from the other of the first and second sides of the package.

BRIEF DESCRIPTION OF THE DRAWINGS

The features and advantages of the lead-frame according to the present invention will be more clearly understood from the following description taken in conjunction with the accompanying drawings in which.

DESCRIPTION OF THE PREFERRED EMBODIMENT

Figure 4:
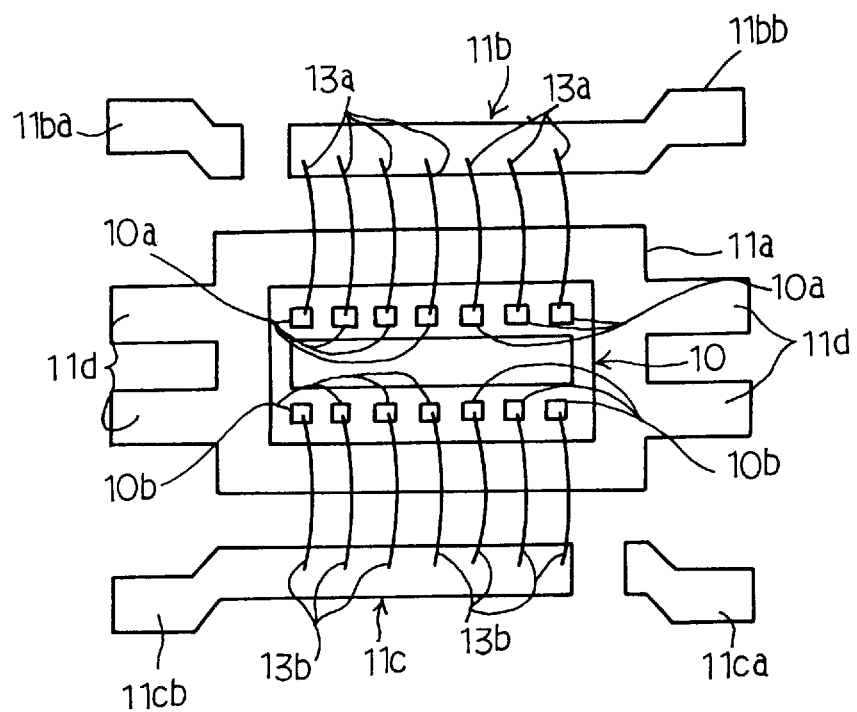
FIG. 4 is a plan view showing the configuration of a lead-frame according to the present invention.

Referring to FIG. 4 of the drawings, a semiconductor chip 10 is assembled with a lead-frame embodying the present invention. A field effect transistor or a plurality of field effect transistors (not shown) are incorporated in the semiconductor chip 10. The field effect transistor or transistors have a source electrode exposed to the back surface of the semiconductor chip 10.

The lead-frame 11 is broken down into a die pad 11a and leads 11b/11c. The semiconductor chip 10 is bonded to the die pad 11a, and a plurality of conductive source terminals 11d project from both sides of the die pad 11a. The die pad 11a and the source terminals 11d are formed of conductive material, and the source terminals 11d are electrically connected through the die pad 11a to the source electrode of the field effect transistor. The leads 11b/11c are formed of copper or copper alloy, and, accordingly, are conductive.

The leads 11b/11c are arranged on both sides of the die pad 11a in parallel thereto, and are spaced from the die pad 11a. The leads 11b/11c have a strip configuration, and serve as a signal input port and a signal output port, respectively. For this reason, the leads 11b/11c are respectively referred to as "input lead" and "output lead" as similar to the prior art lead-frame 1.

Figure 5:
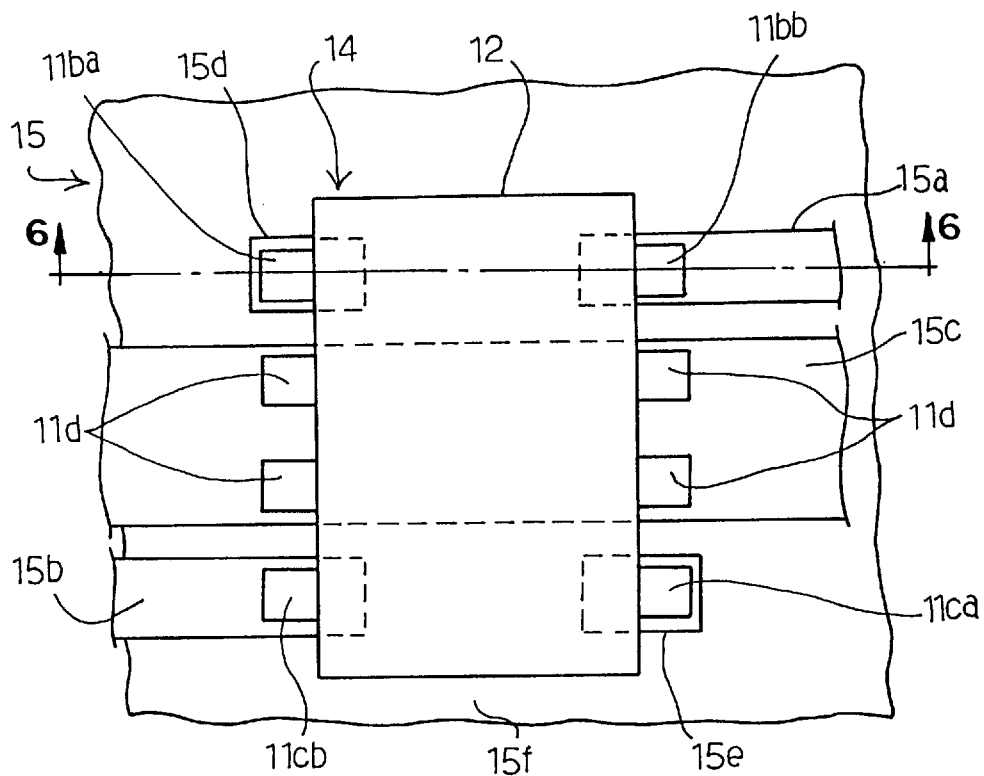
FIG. 5 is a plan view showing a semiconductor device with the lead frame mounted on a circuit board.
Figure 6:
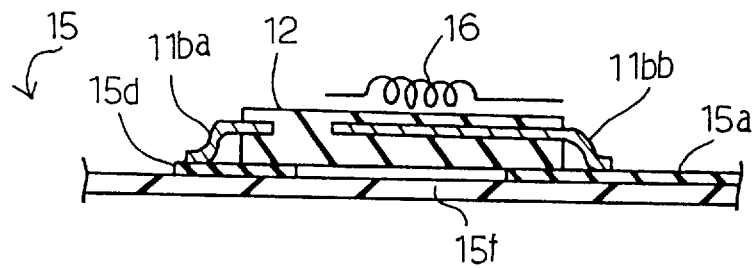
FIG. 6 is a cross sectional view taken along line B—B of FIG. 5 and showing the structure of the semiconductor device.

The input lead 11b has a first input terminal 11ba at one end of the lead-frame 11 and a second input terminal 11bb at the other end of the lead-frame 11. The output lead 11c has a first output terminal 11ca on the same side as the second input terminal 11bb and a second output terminal 11cb on the same side as the first input terminal 11ba. When the lead-frame 11 and the semiconductor chip 10 are sealed in a package 13, the first input terminal 11ba and the second output terminal 11cb project from one side of the package 12, and the second input terminal 11bb and the first output terminal 11ca project from the other side of the package 12 as shown in FIGS. 5 and 6. Thus, the first input terminal 11ba and the first output terminal 11ca are respectively separated from the second input terminal 11bb and the second output terminal 11cb, and the first input terminal 11ba and the first output terminal 11ca are longer than the second input terminal 11bb and the second output terminal 11cb, respectively. For this reason, each of the first/second input terminals 11ba/11bb and each of the first/second output terminals 11ca/11cb are shorter than the input lead 11b and the output lead 11c, respectively.

A plurality of bonding pads 10a/10b are formed on the upper surface of the semiconductor chip 10, and are arranged in two rows. The row of bonding pads 10a and the row of bonding pads 10b are electrically connected to the second input terminal 11bb and the second output terminal 11cb, respectively, by means of conductive bonding wires 13a and 13b. Thus, the second input terminal 11bb and the second output terminal 11cb serve as first and third terminal portions, respectively, and the first input terminal 11ba and the first output terminal 11ca respectively serve as the second and fourth terminal portions.

The lead-frame 11 and the semiconductor chip 10 are sealed in a package 12, and form parts of a semiconductor device 14. In this instance, the second input terminal 11bb and the second output terminal 11cb are arranged at both sides of a diagonal line of the semiconductor device 14.

After completion of the semiconductor device 14, the semiconductor device 14 is mounted on an evaluating board 15 as shown in FIGS. 5 and 6. The evaluating board 15 has an input strip line 15a, an output strip line 15b, a ground strip line 15c and pads 15d/15e on an insulating substrate 15f. The second input terminal 11bb is soldered to the input strip line 15a, and, accordingly, is electrically connected to the input strip line 15a. On the other hand, the first input terminal 11ba is soldered to the pad 15d, and the pad 15d is electrically isolated from the input strip line 15a. Similarly, the second output terminal 11cb is soldered to the output strip line 15b, and, accordingly, is electrically connected to the output strip line 15b. On the other hand, the first output terminal 11ca is soldered to the pad 15e, and the pad 15e is electrically isolated from the output strip line 15b. The source terminals 11d are soldered to the ground strip line 15c, and are electrically connected to the ground strip line 15c. The semiconductor device 14 may be mounted on a circuit board similar to the evaluating board 15.

Figure 1:
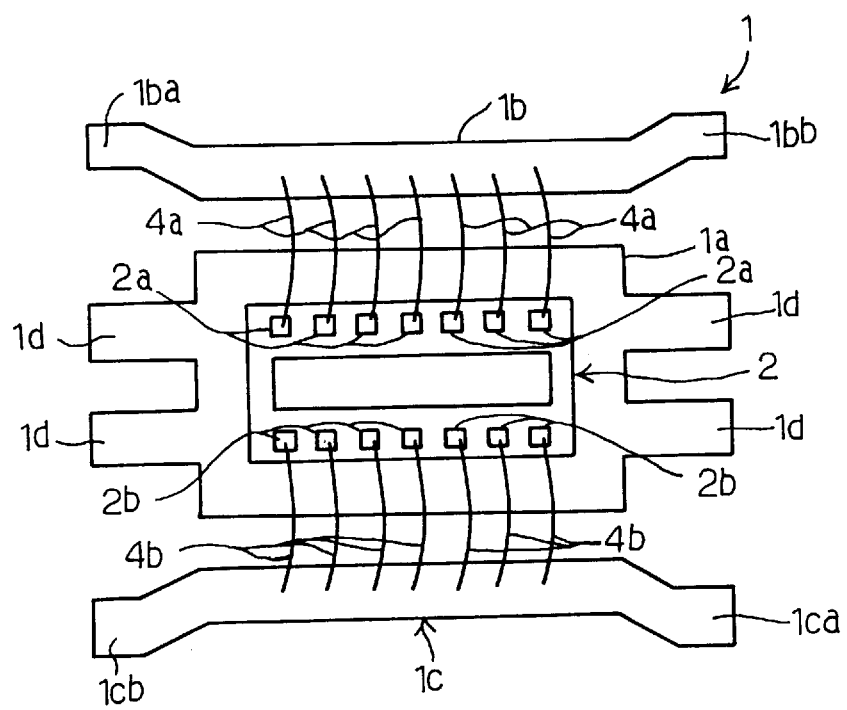
FIG. 1 is a plan view showing the configuration of the prior art lead-frame.
Figure 2:
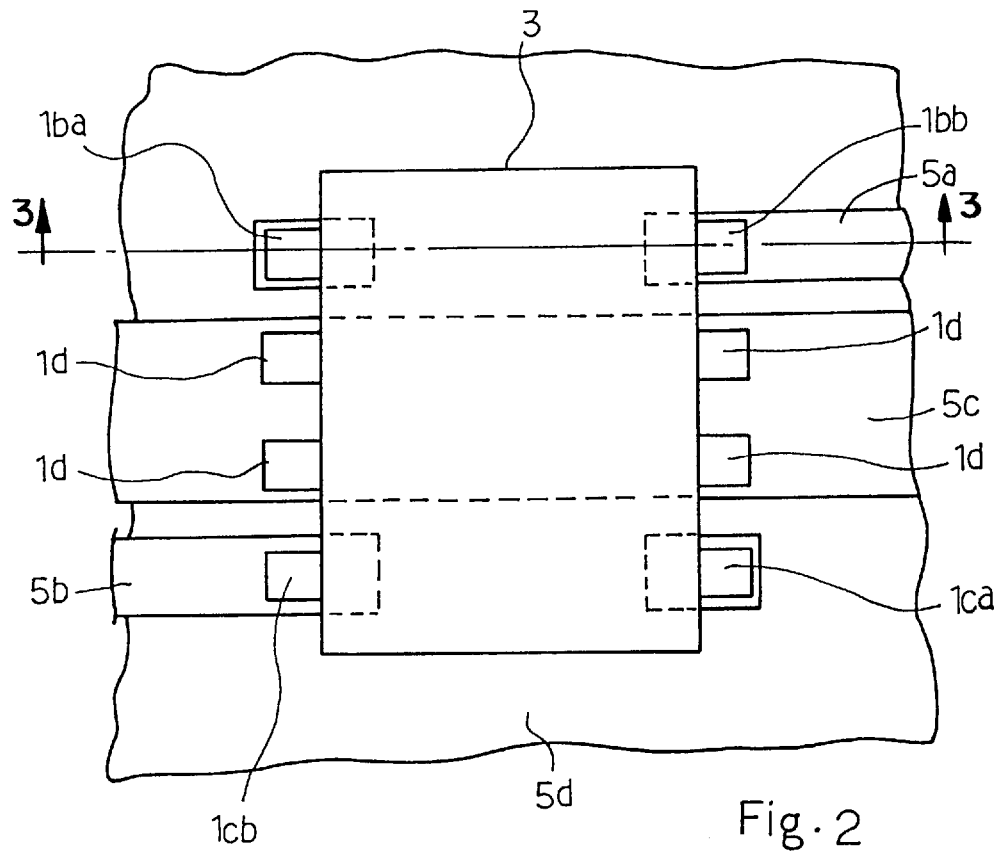
FIG. 2 is a plan view showing the prior art semiconductor device mounted on the circuit board.
Figure 3:
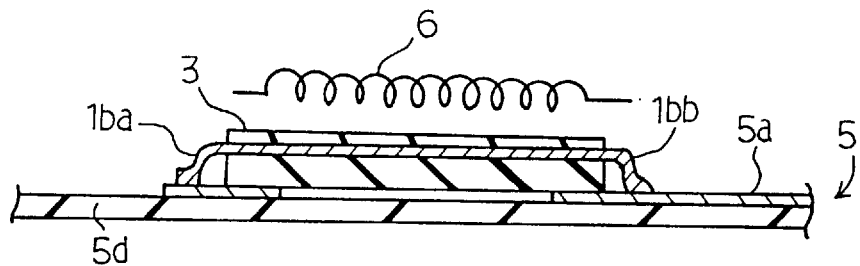
FIG. 3 is a cross sectional view taken along line A—A of FIG. 2 and showing the structure of the prior art semiconductor device.

Parasitic inductance is varied in proportional to the length of a conductive strip. As described hereinbefore, the second input terminal 11bb and the second output terminal 11cb are shorter than the input lead 11b and the output lead 11c, respectively, and the parasitic inductors 16 are smaller than those of the prior art lead-frame shown in FIGS. 1 to 3.

The present inventor fabricated the lead-frame 11 equal in dimensions to the prior art lead-frame 1, and the lead-frame 11 and the prior art lead-frame 1 were respectively sealed in the packages together with respective semiconductor chips 10/2. The second input terminal 11bb and the second output terminal 11cb were two third of the prior art input lead 1b and the prior art output lead 1c, respectively. The parasitic inductance was measured under the same conditions of the prior art semiconductor device. As described hereinbefore, the parasitic inductance of the prior art semiconductor device was 0.99 nH. On the other hand, the parasitic inductance of the semiconductor device 14 was 0.66 nH which was two thirds of the parasitic inductance coupled to the prior art semiconductor device.

The present inventor confirmed that the impedance matching was easier than the prior art, because the positional location of the stub was not so strict as that of the prior art. Moreover, the gain transferred to the output strip line 15b was larger than that of the prior art semiconductor device.

Although particular embodiments of the present invention have been shown and described, it will be obvious to those skilled in the art that various changes and modifications may be made without departing from the spirit and scope of the present invention.

The first and second input terminals 11ba/11bb and the first and second output terminals 11ca/11cb may be halves of the input lead 11b and halves of the output lead 11c, respectively.

What is claimed is:

1. A lead-frame used in a semiconductor device, comprising:

a pad portion for mounting a semiconductor chip thereon;

at least one source terminal connected to said pad portion, and having a leading end portion projecting from a package of said semiconductor device;

at least one input lead area provided on a first side of said pad portion, and having a first terminal portion electrically connected to at least one first bonding pad on said semiconductor chip and partially projecting from a first side of said package and a second terminal portion electrically isolated from said first terminal portion and from said semiconductor chip and partially projected from a second side of said package; and at least one output lead area provided on a second side of said pad portion, and having a third terminal portion electrically connected to at least one second bonding pad on said semiconductor chip and partially projecting from one of said first and second sides of said package and a fourth terminal portion electrically isolated from said third terminal portion and from said semiconductor chip and partially projected from the other of said first and second sides of said package.

2. The lead-frame as set forth in claim 1, in which said first terminal portion and said third terminal portion are different in length from said second terminal portion and said fourth terminal portion, respectively.

3. The lead-frame as set forth in claim 1, in which said first terminal portion and said third terminal portion are longer than said second terminal portion and said fourth terminal portion, respectively.

4. The lead-frame as set forth in claim 1, in which said first terminal portion and said third terminal portion are arranged at both ends of a diagonal line of said package.

5. The lead-frame as set forth in claim 4, in which said first terminal portion and said third terminal portions are respectively connected to an input strip line and an output strip line of an electric board, respectively, and said second terminal portion and said fourth terminal portion are respectively connected to pads on said electric board.

6. The lead-frame as set forth in claim 1, in which said input lead and said output lead are formed of a material selected from the group consisting of copper and copper alloy.

7. The lead-frame as set forth in claim 1, wherein the second terminal portion corresponds to an unused input terminal portion of said at least one input lead area.

8. The lead-frame as set forth in claim 1, wherein the fourth terminal portion corresponds to an unused output terminal portion of said at least one output lead area.

* * * * *